United States Patent
Fujioka et al.

(10) Patent No.: US 6,239,631 B1
(45) Date of Patent: May 29, 2001

(54) INTEGRATED CIRCUIT DEVICE WITH INPUT BUFFER CAPABLE OF CORRESPONDENCE WITH HIGHSPEED CLOCK

(75) Inventors: Shinya Fujioka; Hiroyoshi Tomita, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/377,104

(22) Filed: Aug. 19, 1999

(30) Foreign Application Priority Data

Sep. 24, 1998 (JP) .................................................. 10-269614

(51) Int. Cl.[7] ....................................................... H03L 7/00
(52) U.S. Cl. ............................................. 327/144; 327/141
(58) Field of Search ............................... 326/26, 90, 91, 326/93, 95, 96; 327/108, 114, 208, 144, 145, 210, 211, 212, 214, 239, 141

(56) References Cited

U.S. PATENT DOCUMENTS

| | | | |
|---|---|---|---|
| 4,328,588 | * 5/1982 | Smithson | 327/144 |
| 4,692,932 | * 9/1987 | Denhez et al. | 327/144 |
| 5,694,371 | * 12/1997 | Kawaguchi | 326/96 |
| 5,999,023 | * 12/1999 | Kim | 327/144 |
| 6,040,723 | * 3/2000 | Sato | 327/144 |
| 6,078,202 | * 6/2000 | Tomatsuri et al. | 327/145 |

* cited by examiner

*Primary Examiner*—Kenneth B. Wells
*Assistant Examiner*—Paul Dinh
(74) *Attorney, Agent, or Firm*—Arent, Fox, Kintner, Plotkin, Kahn PLLC

(57) ABSTRACT

One aspect of the present invention is characterized in that an input buffer circuit constitutes either 2 sets, or a plurality of sets relative to 1 input signal, either a pair of complementary internal clocks, or a plurality of internal clocks are generated by frequency-dividing a supplied clock inside the integrated circuit device, and input signals are received and latched either in synchronization with a pair of complementary clocks, or in synchronization with a plurality of clocks in accordance with an input buffer of either 2 sets or a plurality of sets. The output of input buffers of either 2 sets or a plurality of sets are combined by a combining circuit, and supplied internally. An H level or an L level period is set for the internally-generated internal clock so that outputs from the various input buffers are not in contention with one another. According to the present invention, the operation of input buffers of a plurality of sets are synchronized with internal clocks of a slower speed than a supplied clock, thus enabling the reliable receive of input signals.

7 Claims, 10 Drawing Sheets

Internal Clock Generation Element

Clock Buffer 10

Timing Chart of Clock Buffer

Clock Frequency-diving Circuit

Timing Chart of Fig. 5

Synchronization Clock Input

Timing Chart of Synchronization Clock Input

Input Signal Latch 66, 67

Timing Chart of Fig. 7, 10

INTEGRATED CIRCUIT DEVICE WITH INPUT BUFFER CAPABLE OF CORRESPONDENCE WITH HIGHSPEED CLOCK

BACKGROUND OF THE INVENTION

1. Field of the Invention

The present invention relates to an input buffer, which fetches and latches an input signal in synchronization with a clock, and more particularly to an integrated circuit device having an input buffer capable of operating in correspondence with a highspeed clock.

2. Description of the Related Art

To achieve highspeed operation, an integrated circuit device like a highspeed synchronous DRAM has input buffers, which, in synchronization with a clock from the control side, receive and latch inputted signals, such as data, address, and control signals, supplied in synchronization with this clock. Such input buffers receive and internally latch the supplied input signals in synchronization with the rising edge of a clock supplied as a strobe signal. Therefore, the controller side can provide an input signal in synchronization with a clock, enabling the realization of highspeed operation without need for concern over problems such as propagation delay time within the circuit substrate on which the integrated circuit device is mounted.

FIG. 12 is a block diagram of input buffer elements of a conventional integrated circuit device. An integrated circuit device 1 has a clock buffer 10, which receives a clock CLK, a clock compensating element 12, which compensates the phase of an internal clock iclk outputted from the clock buffer 10, and input buffers 20, 21, 22, which, in synchronization with an internal clock clk outputted by the clock compensating element, receive an externally-supplied address Add, control signal $\phi_{CON}$, and data signal DQ.

FIG. 13 is a timing chart showing the operation of the input buffer of FIG. 12. As shown in FIG. 13, the input buffers 20, 21, 22 receive and internally latch supplied input signals Add, $\phi_{CON}$, DQ in synchronization with the rising edge of an internal clock clk phase synchronized to an external clock CLK.

However, if, for example, the frequency of the synchronization clock CLK is around 200 MHz, an input buffer can reliably receive an input signal in synchronization with the rising edge of that clock CLK, but if, for example, the frequency of the synchronization clock CLK is a high frequency of 400 MHz, the operating speed of a input buffer reaches its limit, making a normal input signal capture operation impossible. Moreover, with a highspeed synchronization clock, there are cases in which the clock waveform is disturbed by such factors as noise, making the pulse width extremely narrow, with the result that an input buffer cannot reliably receive an input signal.

Accordingly, an object of the present invention is to provide an integrated circuit device having an input buffer capable of reliably capturing a supplied input signal in synchronization with a highspeed clock.

Furthermore, another object of the present invention is to provide an integrated circuit device having an input buffer capable of reliably receiving a supplied input signal in synchronization with a clock of a wide range from low speed to high speed.

SUMMARY OF THE INVENTION

To achieve the above-mentioned objects, one aspect of the present invention is characterized in that an input buffer circuit constitutes either 2 sets, or a plurality of sets relative to 1 input signal, either a pair of complementary internal clocks, or a plurality of internal clocks are generated by frequency-dividing a supplied clock inside the integrated circuit device, and input signals are received and latched either in synchronization with a pair of complementary clocks, or in synchronization with a plurality of clocks in accordance with an input buffer of either 2 sets or a plurality of sets. The output of input buffers of either 2 sets or a plurality of sets are combined by a combining circuit, and supplied internally. An H level or an L level period is set for the internally-generated internal clock so that outputs from the various input buffers are not in contention with one another. According to the present invention, the operation of input buffers of a plurality of sets are synchronized with internal clocks of a slower speed than a supplied clock, thus enabling the reliable capture of input signals.

Further, according to another aspect of the present invention, when a supplied external clock is a high frequency, input buffers operate in synchronization with frequency-divided internal clocks, and when an external clock is a low frequency, input buffers operate in synchronization with the external clock, thus enabling the input buffers to correspond with an external clock of a wide frequency range.

To achieve the above-mentioned objects, another aspect of the present invention is an integrated circuit device having input buffer, which receives and latches input signal in synchronization with a supplied clock, the integrated circuit device comprising: a frequency-dividing circuit for generating a plurality of different phase internal clocks by frequency-dividing the supplied clock; a plurality of input buffers for receiving and latching the input signal in synchronization with each of the plurality of internal clocks; and a combining circuit for combining the outputs of the plurality of input buffers.

One embodiment of the above-described invention is further characterized in that the combining circuit has a plurality of tri-state buffers, which constitute either a low impedance state including either an H level or an L level or a high impedance state in response to each of the outputs of the plurality of input buffers, and a common output latch circuit to which the outputs of the plurality of tri-state circuit buffers are supplied.

Another embodiment of the above-described invention is further characterized in that it also has a mode register in which a frequency-division control signal is set in accordance with the frequency of the supplied clock, and the frequency-dividing circuit, in accordance with the frequency-division control signal, performs a frequency division operation when the frequency of the supplied clock is higher than a predetermined frequency, and does not perform a frequency division operation when the frequency of the supplied clock is lower than the predetermined frequency. According to this invention, input signals can be reliably received in correspondence to a supplied clock of a wide frequency range.

Another embodiment of the above-described invention is further characterized in that it further has an internal clock inputting circuit, which changes a leading internal clock to the other level when the one level of the frequency-divided internal clocks overlaps, and the plurality of input buffers input the respective internal clocks via the internal clock inputting circuit. Because the invention is constituted so that the one level of the plurality of internal clocks does not overlap, the outputs from the respective input buffers can be prevented from contending with one another in the combining circuit.

DESCRIPTION OF THE PREFERRED EMBODIMENTS

Examples of aspects of the embodiment of the present invention will be explained hereinbelow with reference to the figures. However, such aspects of the embodiment do not constitute the limits of the technological scope of the present invention.

Figure 1:
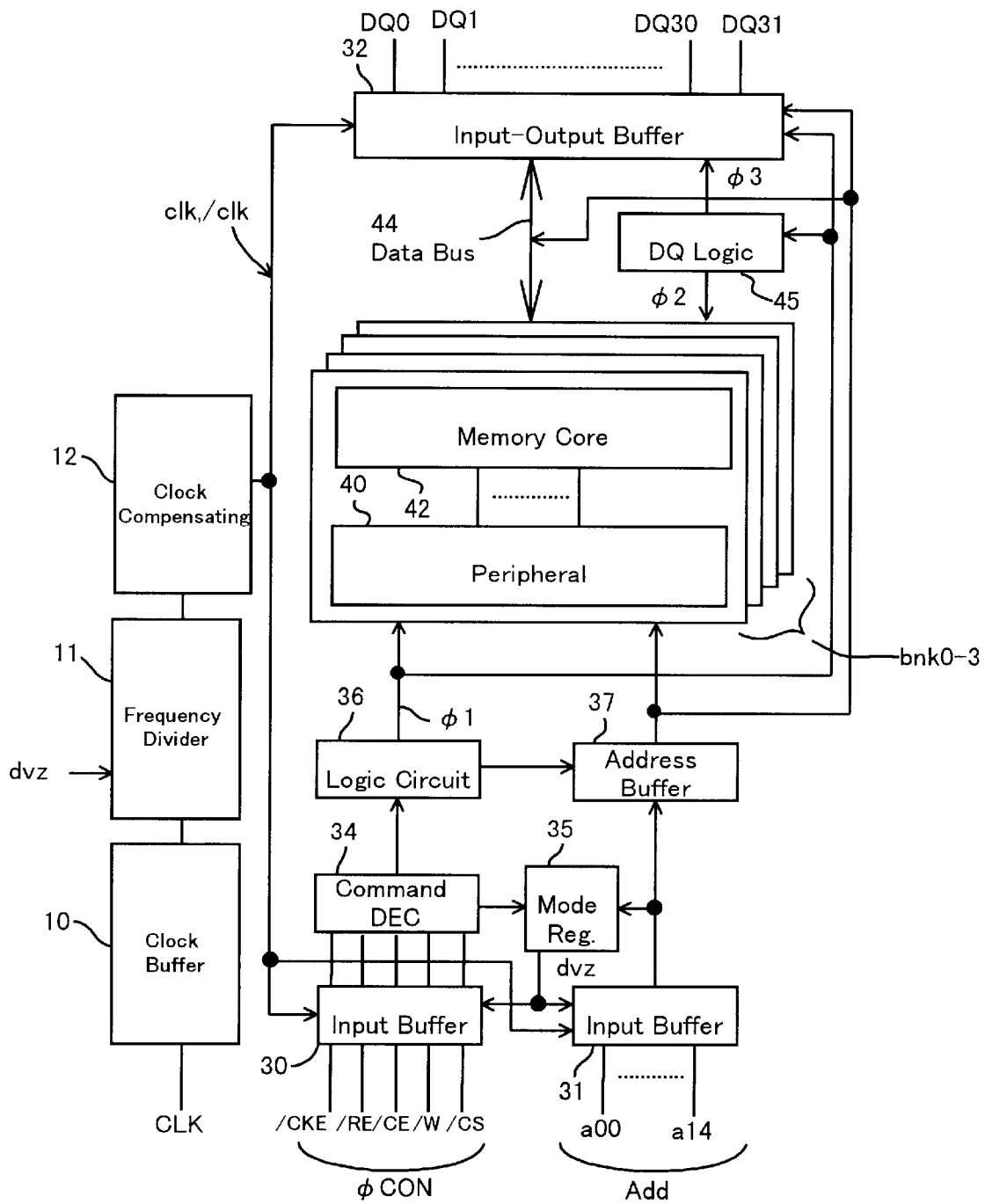
FIG. 1 is a block diagram of an entire memory device, which is an integrated circuit device of an aspect of the embodiment.

FIG. 1 is a block diagram of an entire memory device, which is an integrated circuit device of an aspect of the embodiment. The memory device of FIG. 1 has input buffers 30, 31 for latching a control signal $\phi_{CON}$ and an address Add, and an input-output buffer 32 for latching data DQ0–DQ31. The respective input buffers constitute plural sets of input buffer circuits as described below, and each set operates in synchronization with internal clocks clk, /clk, which were frequency-divided from a supplied clock CLK. The supplied clock CLK is received by a clock buffer 10, and divided by a clock frequency-dividing circuit 11, then the frequency-divided clocks are phase adjusted by a clock compensating circuit 12, and supplied to the above-mentioned input buffers 30, 31, 32 as a plurality of internal clocks clk, /clk having different phases. In the example of FIG. 1, the clock frequency-dividing circuit 11 divides the frequency of the supplied clock CLK in half, and generates 2 internal clocks clk, /clk with phases that differ 180 degrees. Therefore, the input buffers 30, 31, 32 are each constituted from 2 sets of input buffer circuits.

However, according to the present invention, the clock frequency-dividing circuit 11 can divide the frequency of the supplied clock CLK as needed into $N^{ths}$ which are smaller than ½, and can generate N number of internal clocks having different phases. In that case, the input buffers 30, 31, 32 are each constituted from N sets of input buffer circuits, and the respective input buffer circuits sequentially receive and internally latch input signals $\phi_{CON}$, Add, DQ and so forth in synchronization with respective N number of internal clocks.

In the memory device of FIG. 1, the control signals $\phi_{CON}$ sequentially received by input buffer 30 in synchronization with the frequency-divided internal clocks clk, /clk comprise, for example, a clock enable signal /CKE, a row enable signal /RE, a column enable signal /CE, a write signal /W and a chip enable signal ICS, and are supplied to a command decoder 34. The command decoder 34 decodes these control signals $\phi_{CON}$, and either stores latency and burst length mode parameters supplied from an address terminal in a mode register 35, or supplies an internal mode signal to a logic circuit 36. The logic circuit 36, in response to an internal mode signal from the command decoder 34, supplies various timing signals $\phi_1$ to various circuits inside the memory device. The operational timing of circuits inside the memory device is controlled in accordance with these timing signals $\phi_1$.

Addresses $a_{00}$–$a_{14}$ are captured sequentially to input buffer 31 in response to the internal clocks clk, /clk. These addresses are supplied to an address buffer 37, where they are held. The held addresses are supplied to peripheral circuits 40 for memory core 42 like decoders. The addresses are also used in data bus 44 selection and output buffer 32 selection.

Input data DQ is sequentially received by the input buffer 32 in synchronization with the internal clocks clk, /clk.

The 4 memory banks bnk0–bnk3 respectively comprise a memory core 42, having a memory cell matrix, and the peripheral circuits 40 therefor. A DQ logic circuit 45 controls the data flow to/from the input-output buffer 32, providing, for example, a column select signal, readout sense buffer enable signal, a write amp enable signal, and other timing signals $\phi_2$ to the memory banks. The DQ logic circuit 45 also supplies a data output timing signal $\phi_3$ to the input-output buffer 32.

The above-mentioned mode register 35, in response to a mode register sequence signal generated by the command decoder 34, stores the latency for stipulating the number of clocks CLK from a read command to data output. This latency is set in accordance with the frequency of a supplied clock CLK, and the higher the clock CLK frequency, the larger the latency (number of clocks). Therefore, referencing the latency set in the mode register 35 makes possible a determination as to whether or not the frequency of a supplied clock CLK should be divided. Then, in accordance with this latency, the mode register 35 generates a frequency-division control signal dvz, which indicates whether a frequency division operation will be performed or will not be performed, and supplies this frequency-division control signal dvz to the input buffers 30, 31, 32 and the clock frequency-dividing circuit 11. Or, the frequency-division control signal dvz can be set in the mode register 35 using a metal option and a wire bonding option. In this case, the mode register constitutes a frequency-division control setting element.

Figure 2:
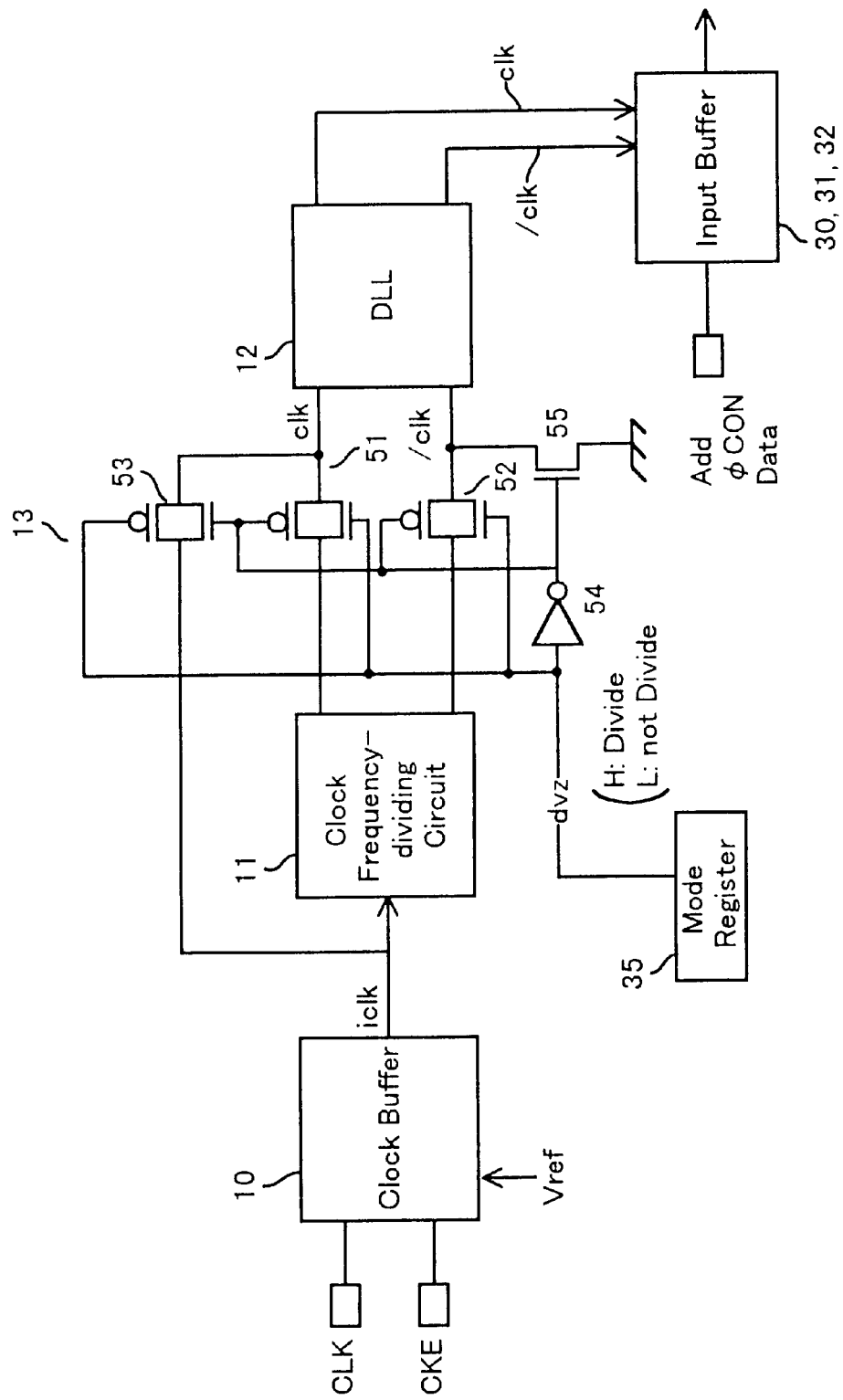
FIG. 2 is a diagram showing an internal clock generating element.

FIG. 2 is a diagram showing an internal clock generating element. The internal clock generating element has a clock buffer 10 for receiving a supplied clock CLK, a clock frequency-dividing circuit 11 for frequency-dividing the received clock iclk thereof, a switching circuit 13 for selecting either the frequency-divided clock, or the clock iclk of prior to frequency-division, and a clock compensating circuit 12, comprising a DLL circuit for either matching the phase of clocks clk, /clk with the phase of a supplied clock CLK, or compensating the phases thereof to a predetermined relationship. The 2 reverse phase internal clocks clk, /clk generated by the internal clock generating element are supplied to the input buffers 30, 31, 32. A clock enable signal CKE, which indicates the validity or non-validity of a supplied clock CLK, is supplied to the clock buffer 10.

A DLL (Delay Locked Loop) circuit comprising the above-mentioned clock compensating circuit 12 is disclosed, for example, in Japanese Patent Laid-open No. 10-112182 (published on Apr. 28, 1998).

Figure 3:
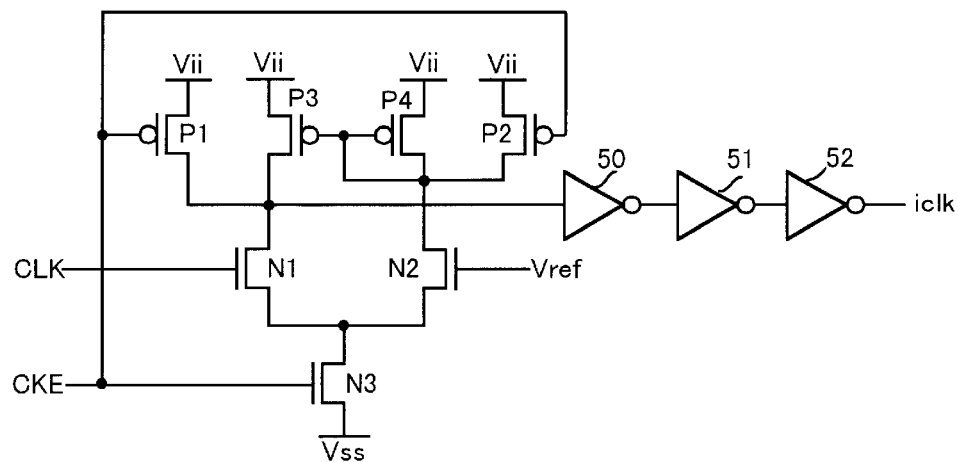
FIG. 3 is a circuit diagram of a clock buffer.

FIG. 3 is a circuit diagram of a clock buffer. The clock buffer 10 has a pair of N-channel transistors N1, N2, of which sources are commonly connected, an N-channel transistor N3, which is controlled by a clock enable signal CKE, P-channel transistors P1, P2, P-channel transistors P3, P4 comprising current mirror circuits, and inverters 50–52. A reference voltage $V_{ref}$ is supplied to the gate of transistor N2, and an externally-supplied clock CLK is supplied to the gate of transistor N1. A supplied clock CLK having a level that accords with an external power source is converted to a level that accords with an internal power source $V_{ii}$, and is subjected to waveform shaping by the clock buffer 10.

Figure 4:
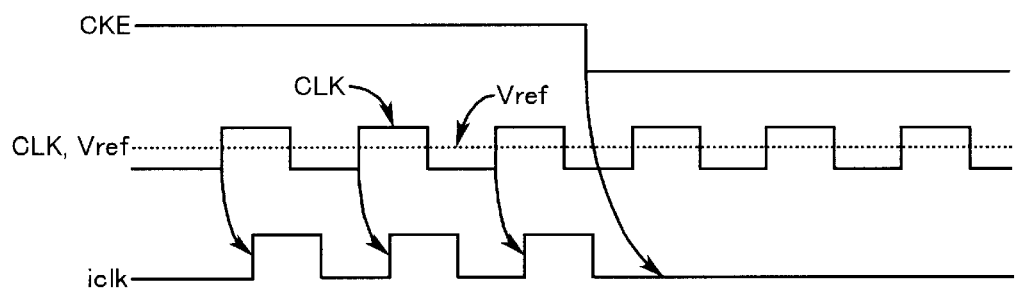
FIG. 4 is a timing chart of a clock buffer.

FIG. 4 is a timing chart of a clock buffer. As shown in FIG. 4, when a clock enable signal CKE is H level, transistor N3 is made to conduct, transistors P1, P2 become non-conductive, a supplied clock CLK is compared to the reference voltage $V_{ref}$, and the supplied clock CLK is converted to an internal clock iclk of a level that accords with the internal power source $V_{ii}$. And when a clock enable signal CKE is L level, transistor N3 becomes non-conductive, transistors P1, P2 constitute a conductive state, and the internal clock iclk is locked at L level.

Figure 5:
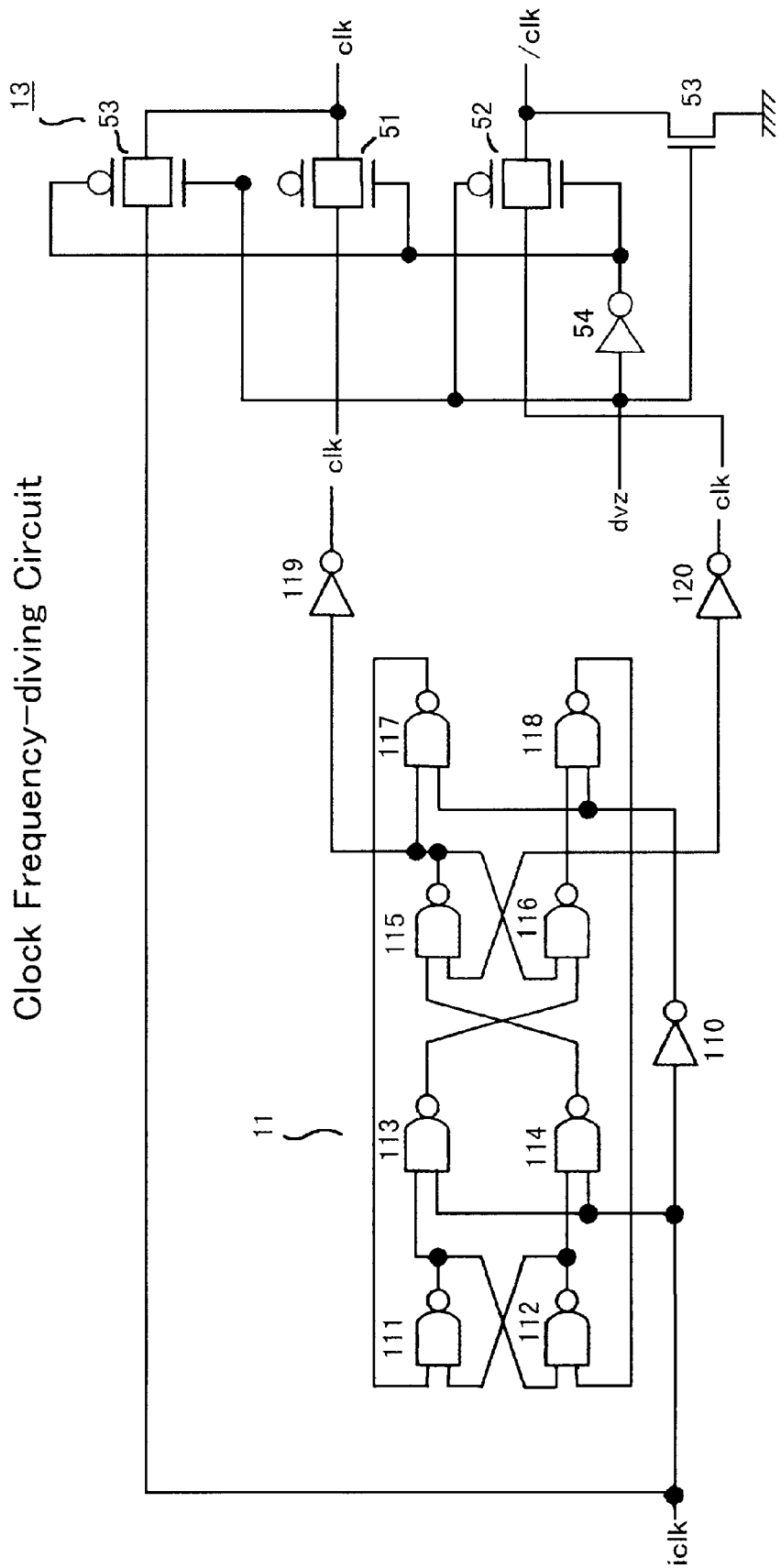
FIG. 5 is a circuit diagram of a clock frequency-dividing circuit.

FIG. 5 is a circuit diagram of a clock frequency-dividing circuit. In FIG. 5, a clock frequency-dividing circuit 11 and a switching circuit 13 are shown. The clock frequency-dividing circuit 11 is a JK flip-flop constituting inverters 110, 119, 120, an initial-stage latching circuit comprising NAND gates 111–114, and a final-stage latching circuit comprising NAND gates 115–118. The clock iclk, which underwent level conversion in the clock buffer 10, is frequency divided to ½ frequency by the clock frequency-dividing circuit 11, and internal clocks clk, /clk, the phases of which are shifted 180 degrees, are generated. A complementary signal held by the initial-stage latching circuit 111, 112 is inverted and transferred to the final-stage latching circuit 115, 116 in response to a clock iclk H level. And this latched complementary signal is transferred to the initial-stage latching circuit 111, 112 in response to a clock iclk L level.

Figure 6:
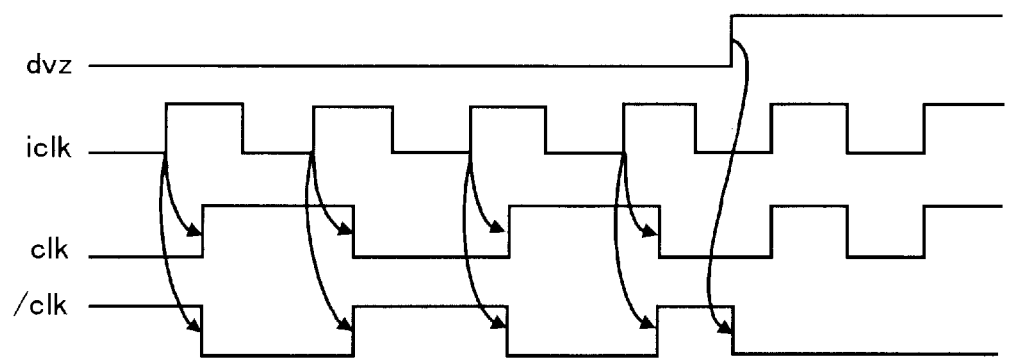
FIG. 6 is a timing chart of the clock frequency-dividing circuit and switching circuit of FIG. 5.

FIG. 6 is a timing chart of the clock frequency-dividing circuit and switching circuit of FIG. 5. When the above-mentioned frequency-division control signal dvz is L level, a frequency division operation is effectuated, and the transfer gates 51, 52 of the switching circuit 13 are in a conductive state. In this case, the clock iclk is divided to ½ frequency, and 2 internal clocks clk, /clk are generated. These 2 internal clocks clk, /clk are complementary clocks, the respective phases of which are shifted 180 degrees. And when the frequency-division control signal dvz is H level, a frequency division operation is prohibited, and the clock iclk, which is outputted by the clock buffer 10 via transfer gate 53, is outputted as an internal clock clk as-is. That is, the internal clock clk in this case is the same frequency as the clock CLK supplied from externally. Then, the other internal clock /clk is locked at L level by the conductive state of transfer gate 53.

Figure 7:
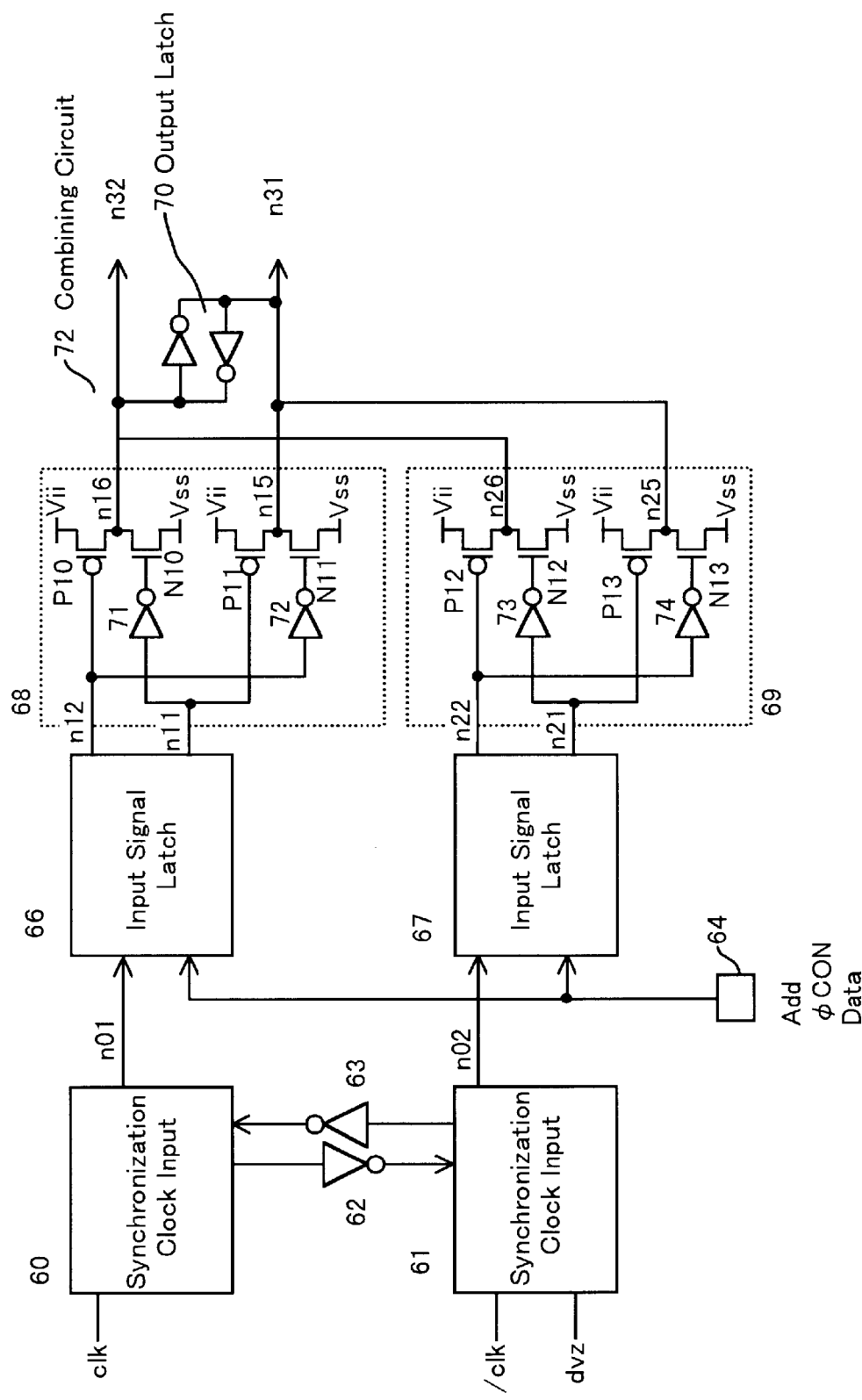
FIG. 7 is a circuit diagram of an input buffer.

FIG. 7 is a circuit diagram of an input buffer. The input buffer has a circuit configuration of 2 circuits, which respectively receive and hold an input signal 64 in response to 2 frequency-divided internal clocks clk, /clk. As shown in FIG. 7, the 2 internal clocks clk, /clk generated by an internal clock generating element are supplied to synchronization clock inputting elements 60, 61. There the timing of the internal clocks clk, /clk is adjusted, and respective latch timing clocks n01, n02 are generated. In response to phase-shifted clocks n01, n02, respectively, input signal latching elements 66, 67 independently sequentially receive and latch input signals 64. Input signal latching element 66, in accordance with an input signal 64, generates complementary signals n11, n12, and controls tri-state buffer 68. And input signal latching element 67, in accordance with an input signal 64, generates complementary signals n21, n22, and controls tri-state buffer 69. Then tri-state buffers 68, 69, respectively, constitute a low impedance state, and a high impedance state of either H level or L level, and the output therefrom n15, n16 and n25, n26, is combined by a wired-OR and latched to an output latching circuit 70 in a combining circuit 72.

Figure 8:
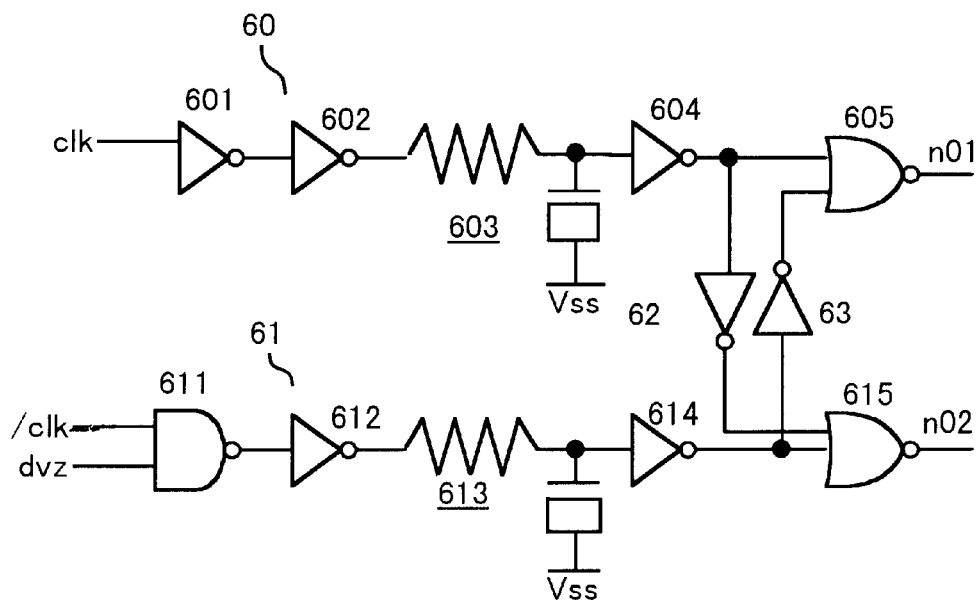
FIG. 8 is a circuit diagram of synchronization clock inputting elements.

FIG. 8 is a circuit diagram of synchronization clock inputting elements. Synchronization clock inputting element 60 has inverters 601, 602, a phase adjustment delay circuit 603, an inverter 604, and a NOR gate 605. And synchronization clock inputting element 61 has a NAND gate 611, an inverter 612, a phase adjustment delay circuit 613, an inverter 614, and a NOR gate 615. These synchronization clock inputting elements 60, 61 are constituted independently, are inputted with 2 internal clocks clk, /clk each having a different phase, and are delayed in accordance with phase adjustment delay circuits 603, 613 by the time required for input signal 64 setup. Further, the outputs of inverters 604, 614 are supplied to NOR gates 605, 615 via inverters 62, 63, respectively, and are controlled so that the H level states of output clocks n01, n02 do not overlap. And a frequency division control signal dvz is inputted to NAND gate 611, and when frequency division is not performed, the frequency division control signal dvz becomes L level, and the synchronization clock inputting element 61 prohibits the inputting of clock /clk.

Figure 9:
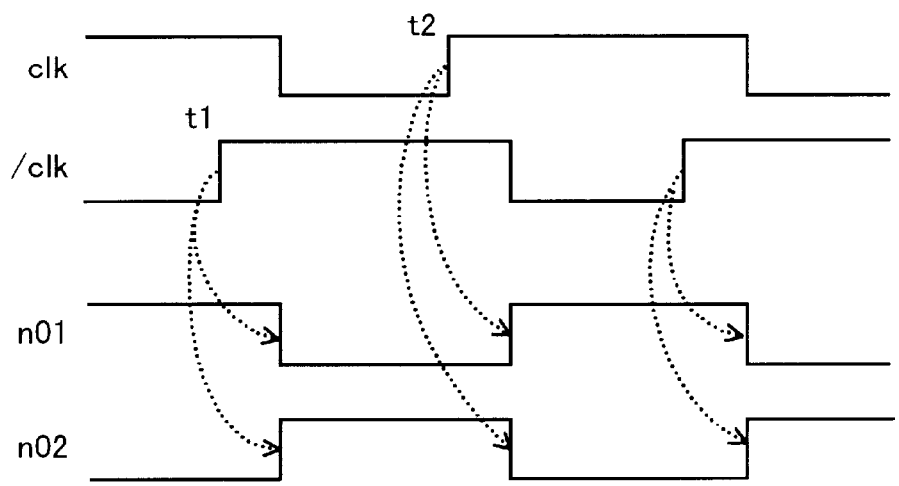
FIG. 9 is timing chart of the synchronization clock inputting element of FIG. 8.

FIG. 9 is a timing chart of the synchronization clock inputting element of FIG. 8. In this example, the H levels of the internal clocks clk, /clk from the clock frequency-dividing circuit 11 partially overlap. This H level overlap occurs as a result of a mismatch in the number of gate stages in the constitution of the clock frequency-dividing circuit 11 comprising the JK flip-flop circuit shown in FIG. 5. Of course, there are also other reasons for the occurrence of H level overlap.

As was shown in FIG. 8, output clock n01 is a clock of the same phase as the frequency-divided internal clock clk. Similarly, output clock n02 is a clock of the same phase as the frequency-divided internal clock /clk. However, at timing t1, the H level of output clock n01 corresponding to the leading H level clock clk is lowered to L level by inverters 62, 63 in accordance with the rising edge of subsequently-generated clock /clk. Further, the output clock n02 of the one L level rises to H level in response to the rising edge of clock /clk.

Similarly, at timing t2, the H level of output clock n02 corresponding to the leading H level clock /clk is lowered to L level in accordance with the rising edge of subsequently-generated clock clk. Then, L level output clock n01 rises to H level in response to the rising edge of clock clk. However, the changes in the respective output clocks n01, n02 occur at timings delayed by delay circuits 603, 613 and the number of other gates from the rising edges of the inputted internal clocks clk, /clk.

Therefore, the output clocks n01, n02 of the synchronization clock inputting elements 60, 61 are delayed a predetermined time from the frequency-divided internal clocks clk, /clk, and are generated so that H levels do not overlap.

Figure 10:
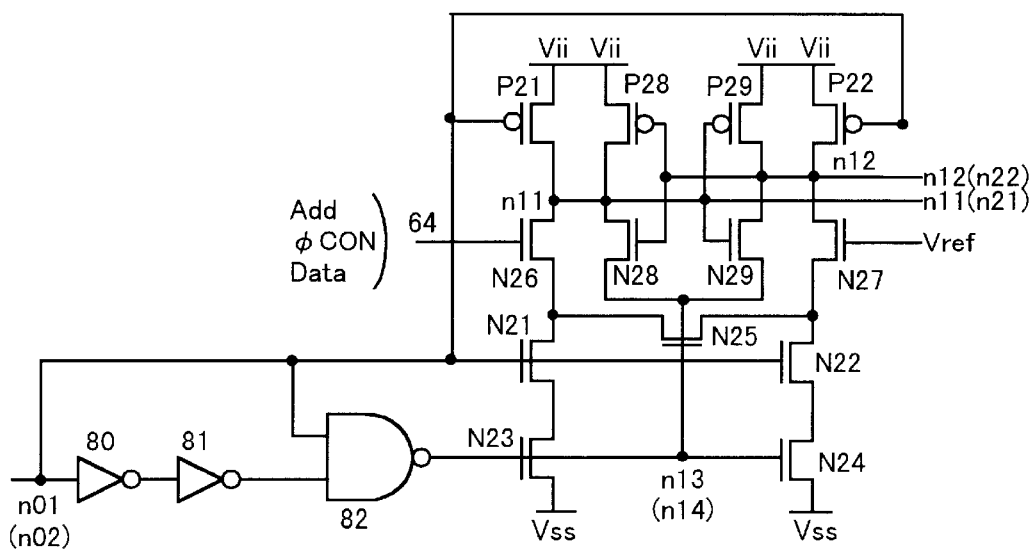
FIG. 10 is a circuit diagram of an input signal latching element.

FIG. 10 is a circuit diagram of an input signal latching element. Since input signal latching elements 66, 67 are the same circuit configuration, only 1 input signal latching element is shown in FIG. 10. Clock n01 is supplied to the input signal latching element via inverters 80, 81 and NAND gate 82, and an input signal 64 is supplied to the gate of N-channel transistor N26. N-channel transistors N21, N22 are controlled by clock n01, and transistors N23, N24, N25 are controlled by the output of NAND gate 82. Transistors N26, N27 constitute a comparator for comparing an input signal 64 against a reference voltage $V_{ref}$, and transistors P28, P29 and N28, N29 are circuits for amplifying and latching the comparison results thereof. P-channel transistors P21, P22 are conductive when clock n01 is L level, and maintain outputs n11, n12 at H level (the level of power source $V_{ii}$). Further, the output n13 of NAND gate 82 becomes H level in accordance with the L level of clock n01, and together transistors N23, N24, N25 are in the conductive state. This is the inactive state of an input signal latching circuit.

Figure 11:
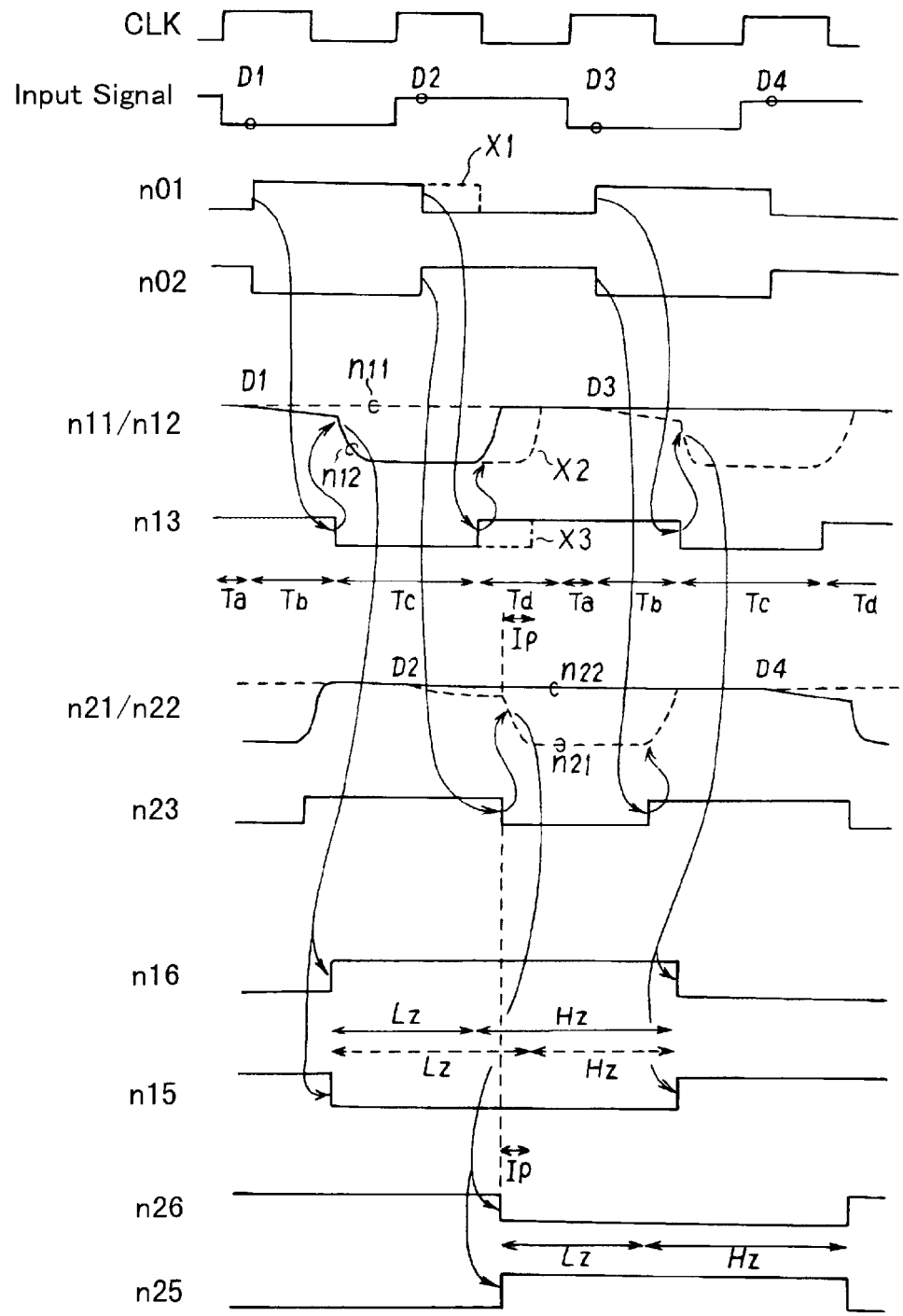
FIG. 11 is a timing chart showing the operations of FIG. 7 and FIG. 10.
Figure 12:
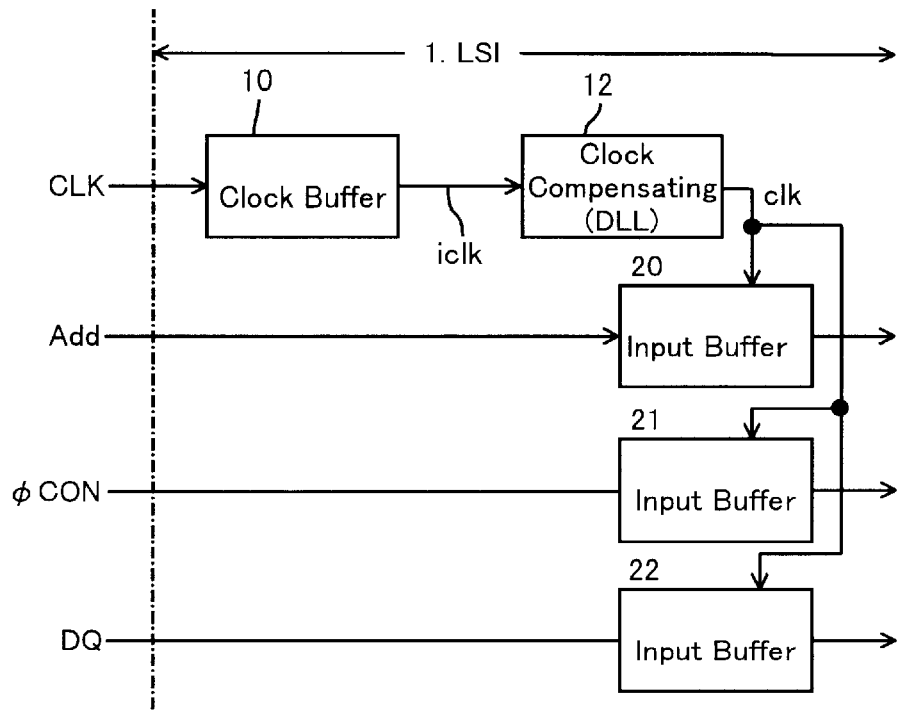
FIG. 12 is a block diagram of the input buffer portion of a conventional integrated circuit device.
Figure 13:
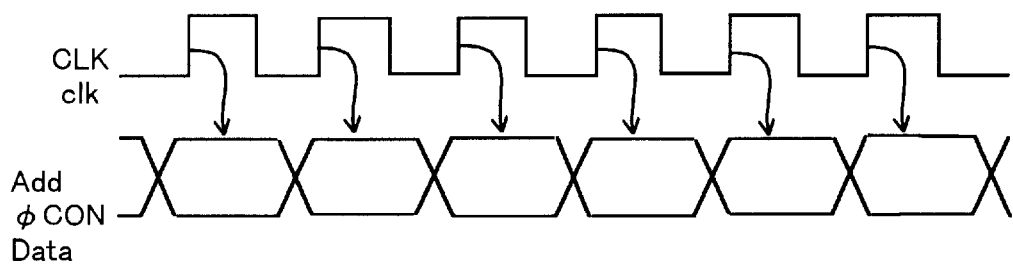
FIG. 13 is a timing chart showing the operation of the input buffer of FIG. 12.

FIG. 11 is a timing chart showing the operations of FIG. 7 and FIG. 10. The operation of the input signal latching element of FIG. 10 will be explained with reference to FIG. 11. First, from the above-mentioned inactive state, when clock n01 rises from L level to H level, the P-channel transistors P21, P22 become non-conductive, and transistors N21, N22 are made conductive. Therefore, the common source of transistors N26, N27 is pulled down toward ground potential $V_{SS}$, and, in accordance with an input signal 64, a difference in the amount of current of transistors N26, N27 occurs as a result of a differential amplifying operation. Because the input signal D1 of FIG. 11 is L level, the output n12 drops slightly to the L level side.

Accordingly, after a delay (Tb) of inverters 80, 81 and NAND gate 82 following the rise of clock n01, node n13 falls to L level. As a result, together with transistors N23, N24, N25 becoming non-conductive, the common source terminal of transistors N28, N29 is pulled down, and the voltage difference of outputs n11, n12 is amplified and latched by transistors P28, P29, N28, N29. As a result, output n12 is driven to L level, and output n11 is maintained as-is at H level.

Then, after a delay (Tc) of NAND gate 82 from the falling edge of clock n01, node n13 rises, the latch state is canceled, and outputs n11, n12 are reset to H level by the conductive states of P-channel transistors P21, P22.

As is also indicated in FIG. 11 above, period Ta is an input signal setup period, period Tb is a differential amplifying period in accordance with transistors N26, N27, period Tc is a latching period in accordance with transistors P28, P29, N28, N29, and period Td is a reset period.

In the example shown in FIG. 11, the H level of input signal D2 is received by input signal latching element 67, and output n21 and output n22 are driven to L level and H level, respectively. Because input signal D2 is H level, which is the inverted level of the D1 L level, the operation of the input signal latching element is also reversed.

FIG. 7 shows tri-state buffers 68, 69, which are controlled by outputs n11, n12, and n21, n22 of input signal latching elements 66, 67. Tri-state buffer 68 has a buffer circuit comprising P-channel transistor P10 and N-channel transistor N10, and a buffer circuit comprising transistors P11, N11, and these buffer circuits are controlled in reverse phase by outputs n11, n12, respectively. With respect to input signal D1 of FIG. 11, since output n11 is H level, and output n12 is L level, node n16 is driven to H level, and node n15 is driven to L level, respectively, by the above-mentioned buffer circuits. That is, nodes n15, n16 constitute low impedance states Lz. And then, when input signal latching element 66 is reset, outputs n11, n12 together become H level, transistors P10, N10, P11, N11 all become non-conductive, and nodes n15, n16 constitute high impedance states Hz.

Further, tri-state buffer 69 has a buffer circuit comprising P-channel transistor P12 and N-channel transistor N12, and a buffer circuit comprising transistors P13, N13, and these buffer circuits are controlled in reverse phase by outputs n21, n22, respectively. With respect to input signal D2 of FIG. 11, since output n22 is H level, and output n21 is L level, node n26 is driven to L level, and node n25 is driven to H level, respectively, by the above-mentioned buffer circuits. That is, nodes n25, n26 constitute low impedance states Lz. And then, when input signal latching element 67 is reset, outputs n21, n22 together become H level, transistors P12, N12, P13, N13 all become non-conductive, and nodes n25, n26 constitute high impedance states Hz.

In the period of the high impedance state Hz of nodes n25, n26, the state of nodes n15, n16 is latched to output latching circuit 70 of combining circuit 72. Further, in the period of the high impedance state Hz of nodes n15, n16 of thereafter, the state of nodes n25, n26 is latched to output latching circuit 70 of combining circuit 72. As shown in FIG. 11, the high impedance state Hz and low impedance state Lz of nodes n15, n16, and the low impedance state Lz and high impedance state Hz of nodes n25, n26 are alternate.

However, in the synchronization clock inputting element of FIG. 8, when the H levels of the frequency-divided internal clocks clk, /clk overlap as shown in the timing chart of FIG. 9, the overlap of the H levels of output clocks n01, n02 is prevented by inverters 62, 63. Now, if the H levels of output clocks n01 and n02 were to overlap, the waveforms would become just like X1, X2, X3 in FIG. 11. That is, if the fall of clock n01 is delayed more than the rising edge of clock n02 (X1), the rising edge of node n13 of the input signal latching element 66 is also delayed in accordance therewith (X3). As a result, the reset operation of output n12 is also delayed (X2). In accordance therewith, the transition of tri-state buffer 68 nodes n15, n16 from a low impedance state Lz to a high impedance state Hz is also delayed, and the low impedance state Lz of nodes n15, n16 (indicated by the broken line in the figure) partially overlaps with the low impedance state Lz of nodes n25, n26 as indicated by Ip in FIG. 11.

As for this kind of low impedance state overlap, when various input signals 64 are reverse phase, a penetrating current Ip is generated between the tri-state buffers 68, 69 of FIG. 7. That is, in the tri-state buffer of FIG. 7, a penetrating current flows from transistor P10 toward transistor N12, and a penetrating current flows from transistor P13 toward transistor N11. Therefore, in the synchronization clock inputting element of FIG. 8, control is implemented so that the H levels of clocks n01, n02 do not overlap.

The problem with the above-mentioned penetrating current is that it tends to occur more readily in the case of high frequency clocks in particular. That is, the higher the frequency of a clock CLK, the shorter its cycle becomes. As for the latch period Tc of the input signal latching elements 66, 67, more than sufficient time must be set to reverse the latch state of the output latching circuit 70 of the combining circuit 72. Then, the low impedance state Lz period of the tri-state buffers 68, 69 is the same as the latch period Tc thereof, and is constant. Accordingly, when the clock CLK cycle shortens, the total time of the low impedance state Lz and high impedance state Hz is shortened, and the low impedance states Lz of tri-state buffers 68 and 69 approach one another as in FIG. 11. In this state, when the falling edge of clock n01 is delayed even slightly as in X1, the low impedance state Lz periods of both buffers 68, 69 will overlap.

Therefore, when operating a 2-circuit input buffer in accordance with frequency-divided clocks, and combining the outputs thereof, measures must be taken so that the effective periods of the respective input buffer outputs do not contend with one another.

In the above-described aspect of the embodiment, the explanation dealt with an example in which a supplied clock CLK was frequency-divided to ½ frequency, and the input buffers constituted 2 circuits. However, the present invention is not limited thereto, and can also frequency-divide a supplied clock CLK to ½ frequency, generate 4 internal clocks, the phases of which are shifted 90 degrees each, and operate a 4-circuit input buffer in synchronization with the respective internal clocks. Furthermore, the present invention can also frequency-divide a supplied clock CLK to Nth frequency, generate N number of internal clocks with different phases, and operate an N-circuit input buffer in synchronization with the respective internal clocks.

As described above, according to the present invention, it is possible to provide an integrated circuit device having input buffers, which reliably receive and internally latch supplied input signals in synchronization with a high speed clock.

Furthermore, according to the present invention, it is possible to provide an integrated circuit device having input buffers, which reliably receive and internally latch input signals in correspondence with a clock of a wide frequency range.

What is claimed is:

1. An integrated circuit device, which has an input buffer that receives and latches an input signal in synchronization with a supplied clock, comprising:
    a frequency-dividing circuit for generating a plurality of different-phase internal clocks by frequency-dividing said supplied clock;
    a plurality of input buffers, each receiving and latching said input signal in synchronization with corresponding one of said plurality of internal clocks; and
    a combining circuit for combining the outputs of said plurality of input buffers, wherein:
    said combining circuit comprises:
    a plurality of tri-state buffers, which constitute either a low impedance state of either an H level or an L level or a high impedance state in response to the respective outputs of said plurality of input buffers; and
    a common output latching circuit, to which the outputs of said plurality of tri-state buffers are supplied.

2. An integrated circuit device, which has an input buffer that receives and latches an input signal in synchronization with a supplied clock, comprising:
    a frequency-dividing circuit for generating a plurality of different-phase internal clocks by frequency-dividing said supplied clock;
    a plurality of input buffers, each receiving and latching said input signal in synchronization with corresponding one of said plurality of internal clocks;
    a combining circuit for combining the outputs of said plurality of input buffers;
    a mode register, in which a frequency division control signal is set in accordance with the frequency of said supplied clock; and
    said frequency-dividing circuit, in accordance with said frequency division control signal, performs a frequency division operation when the frequency of said supplied clock is higher than a predetermined frequency, and does not perform a frequency division operation when the frequency of said supplied clock is lower than said predetermined frequency.

3. An integrated circuit device, which has an input buffer that receives and latches an input signal in synchronization with a supplied clock, comprising:
    a frequency-dividing circuit for generating a plurality of different-phase internal clocks by frequency-dividing said supplied clock;
    a plurality of input buffers, each receiving and latching said input signal in synchronization with corresponding one of said plurality of internal clocks;
    a combining circuit for combining the outputs of said plurality of input buffers;
    a frequency division control setting element, in which a frequency division control signal is set; and
    said frequency-dividing circuit performs said frequency division operation when said frequency division control signal is in a first state, and does not perform said frequency division operation when said frequency division control signal is in a second state.

4. The integrated circuit device according to claim 2 wherein:
    when said frequency-dividing circuit does not perform a frequency division operation, a prescribed input buffer among said plurality of input buffers receives and latches said input signal in synchronization with said supplied clock.

5. An integrated circuit device, which has an input buffer that receives and latches an input signal in synchronization with a supplied clock, comprising:
    a frequency-dividing circuit for generating a plurality of different-phase internal clocks by frequency-dividing said supplied clock;
    a plurality of input buffers, each receiving and latching said input signal in synchronization with corresponding one of said plurality of internal clocks;
    a combining circuit for combining the outputs of said plurality of input buffers;
    an internal clock inputting circuit, which, when said one level of said frequency-divided internal clocks overlaps, changes the leading internal clock to the other level; and
    said plurality of input buffers input respective said internal clocks via said internal clock inputting circuit.

6. An integrated circuit device, which has an input buffer that receives and latches an input signal in synchronization with a supplied clock, comprising:
    a frequency-dividing circuit for generating a plurality of different-phase internal clocks by frequency-dividing said supplied clock;
    a plurality of input buffers, each receiving and latching said input signal in synchronization with corresponding one of said plurality of internal clocks;
    a combining circuit for combining the outputs of said plurality of input buffers;

a clock compensating circuit for adjusting the phases of said internal clocks, generated by said frequency-dividing circuit, to a prescribed relationship with the phase of said supplied clock; wherein said internal clocks, the phases of which are adjusted by said clock compensating circuit, are supplied to said input buffers.

7. The integrated circuit device according to claim 3, wherein:

when said frequency-dividing circuit does not perform a frequency division operation, a prescribed input buffer among said plurality of input buffers receives and latches said input signal in synchronization with said supplied clock.

\* \* \* \* \*